(12) United States Patent
Poremba et al.

(10) Patent No.: US 9,087,561 B2
(45) Date of Patent: Jul. 21, 2015

(54) HYBRID CACHE

(71) Applicant: ADVANCED MICRO DEVICES, INC., Sunnyvale, CA (US)

(72) Inventors: Matthew R. Poremba, Shavertown, PA (US); Gabriel H. Loh, Bellevue, WA (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 212 days.

(21) Appl. No.: 13/724,669

(22) Filed: Dec. 21, 2012

(65) Prior Publication Data

US 2014/0181387 A1    Jun. 26, 2014

(51) Int. Cl.
G06F 12/04 (2006.01)
G11C 7/10 (2006.01)
G06F 12/08 (2006.01)

(52) U.S. Cl.
CPC .......... *G11C 7/1072* (2013.01); *G06F 12/0886* (2013.01); *G06F 2212/1041* (2013.01); *G06F 2212/601* (2013.01)

(58) Field of Classification Search
CPC ... G06F 12/088; G06F 12/12; G06F 12/0886; G06F 2212/1041; G06F 2212/601; G11C 7/1072
See application file for complete search history.

(56) References Cited

U.S. PATENT DOCUMENTS

| | | | |
|---|---|---|---|
| 5,367,653 A * | 11/1994 | Coyle et al. | 711/128 |
| 5,721,874 A * | 2/1998 | Carnevale et al. | 711/171 |
| 5,905,997 A | 5/1999 | Stiles | |
| 6,349,364 B1 * | 2/2002 | Kai et al. | 711/133 |
| 7,406,579 B2 * | 7/2008 | Blanco et al. | 711/172 |
| 7,543,113 B2 * | 6/2009 | Walker et al. | 711/128 |
| 8,059,441 B2 | 11/2011 | Taufique et al. | |
| 8,706,969 B2 * | 4/2014 | Anderson et al. | 711/122 |
| 8,719,503 B2 * | 5/2014 | Koob et al. | 711/118 |
| 2006/0059309 A1 * | 3/2006 | Harada | 711/118 |
| 2006/0218348 A1 * | 9/2006 | Shaw et al. | 711/118 |
| 2010/0185816 A1 * | 7/2010 | Sauber et al. | 711/122 |

OTHER PUBLICATIONS

MICRO 11, Efficiently enabling conventional block sizes for very large die-stacked DRAM Caches by Gabriel H. Loh and Mark D. Hill, Dec. 3-7, 2011, Porto Alegre, Brazil.

\* cited by examiner

*Primary Examiner* — Hiep Nguyen
(74) *Attorney, Agent, or Firm* — Park, Vaughan, Fleming & Dowler LLP

(57) ABSTRACT

Data caching methods and systems are provided. A method is provided for a hybrid cache system that dynamically changes modes of one or more cache rows of a cache between an un-split mode having a first tag field and a first data field to a split mode having a second tag field, a second data field being smaller than the first data field and a mapped page field to improve the cache access efficiency of a workflow being executed in a processor. A hybrid cache system is provided in which the cache is configured to operate one or more cache rows in an un-split mode or in a split mode. The system is configured to dynamically change modes of the cache rows from the un-split mode to the split mode to improve the cache access efficiency of a workflow being executed by the processor.

20 Claims, 6 Drawing Sheets

HYBRID CACHE

TECHNICAL FIELD

The disclosed embodiments relate to the field of memory caches for a processor.

BACKGROUND

Die-stacking technology enables multiple layers of Dynamic Random Access Memory (DRAM) to be integrated with single or multicore processors. Die-stacking technologies provide a way to tightly integrate multiple disparate silicon die with high-bandwidth, low-latency interconnects. The implementation could involve vertical stacking as illustrated in FIG. 1A, in which a plurality of DRAM layers 100 are stacked above a multicore processor 102. Alternately, as illustrated in FIG. 1B, a horizontal stacking of the DRAM 100 and the processor 102 can be achieved on an interposer 104. In either case the processor 102 (or each core thereof) is provided with a high bandwidth, low-latency path to the stacked memory 100.

Computer systems typically include a processing unit, a main memory and one or more cache memories. A cache memory is a high-speed memory that acts as a buffer between the processor and the main memory. Although smaller than the main memory, the cache memory typically has appreciably faster access time than the main memory. Memory subsystem performance can be increased by storing the most commonly used data in smaller but faster cache memories.

Generally, the main memory of a computer system has a memory organization at the page level of granularity. Typically, a page may be a four kilobyte (KB) page, although any other size page may be defined for a particular implementation. Cache memory organization is generally at a cacheline level of granularity. A cacheline is a set of bytes stored in contiguous memory locations, which are treated as a unit for coherency purposes. As used herein, each of the terms "cacheline" and "cache block" are interchangeable. The number of bytes in a cacheline may be varied according to design choice, and may be of any size.

Various workloads executed by a processor have memory access patterns that function more efficiently with page level data or cacheline level data. In a conventional cache, only a single granularity is supported. This results in some workload functioning more efficiently than other workloads. Alternately, when a workload is launched (begin of execution), the computer system could implement a partition of the cache memory so that a portion of the cache memory can be organized at a page level. However, partitioning the cache reduces the available size of the cache for storing data at cacheline granularity, which may lead to an increase in cache misses due to the reduced storage capacity for these cachelines.

SUMMARY OF THE EMBODIMENTS

A method is provided for a hybrid cache system. The method includes dynamically changing modes of one or more cache rows of a cache between an un-split mode having a first tag field and a first data field to a split mode having a second tag field, a second data field being smaller than the first data field and a mapped page field to improve the cache access efficiency of a workload being executed in a processor.

A hybrid cache system is provided. The system includes a processor, a memory coupled to the processor and a cache coupled to the processor and the memory. The cache is configured to operate one or more cache rows in an un-split mode having a first tag field and a first data field and operate one or more cache rows in a split mode having a second tag field, a second data field being smaller than the first data field and a page field. The system is configured to dynamically change modes of the cache rows from the un-split mode to the split mode to improve the cache access efficiency of a workflow being executed by the processor.

BRIEF DESCRIPTION OF THE DRAWINGS

The embodiments will hereinafter be described in conjunction with the following drawing figures, wherein like numerals denote like elements.

DETAILED DESCRIPTION

The following detailed description is merely exemplary in nature and is not intended to limit the disclosure or the application and uses of the disclosure. All of the embodiments described herein are provided to enable persons skilled in the art to make or use the disclosed embodiments and not to limit the scope of the disclosure which is defined by the claims. Furthermore, there is no intention to be bound by any expressed or implied theory presented in the preceding technical field, background, brief summary, the following detailed description or for any particular computer system.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language.

Additionally, the following description refers to elements or features being "connected" or "coupled" together. As used herein, "connected" may refer to one element/feature being directly joined to (or directly communicating with) another element/feature, and not necessarily mechanically. Likewise, "coupled" may refer to one element/feature being directly or indirectly joined to (or directly or indirectly communicating with) another element/feature, and not necessarily mechanically. However, it should be understood that, although two elements may be described below as being "connected," similar elements may be "coupled," and vice versa. Thus, although the block diagrams shown herein depict example arrangements of elements, additional intervening elements, devices, features, or components may be present in an actual embodiment.

Finally, for the sake of brevity, conventional techniques and components related to computer systems and other functional aspects of a computer system (and the individual operating components of the system) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment.

Figure 1A:
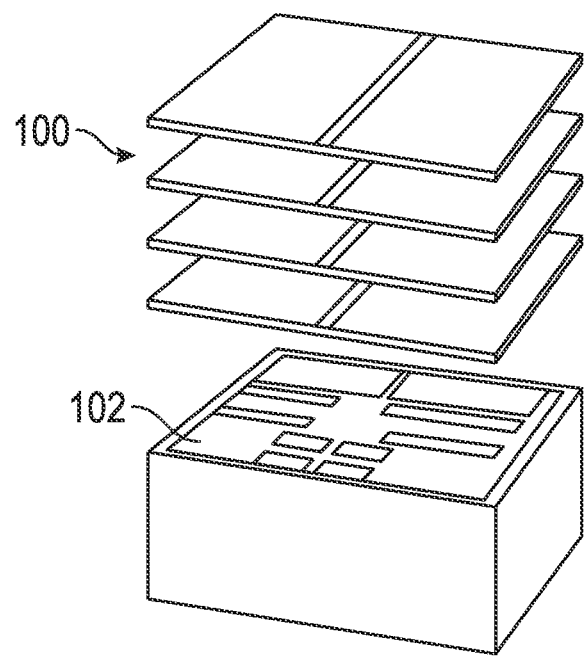
FIGS. 1A and 1B are illustrations of a conventional die-stacked memory and processor.
Figure 1B:
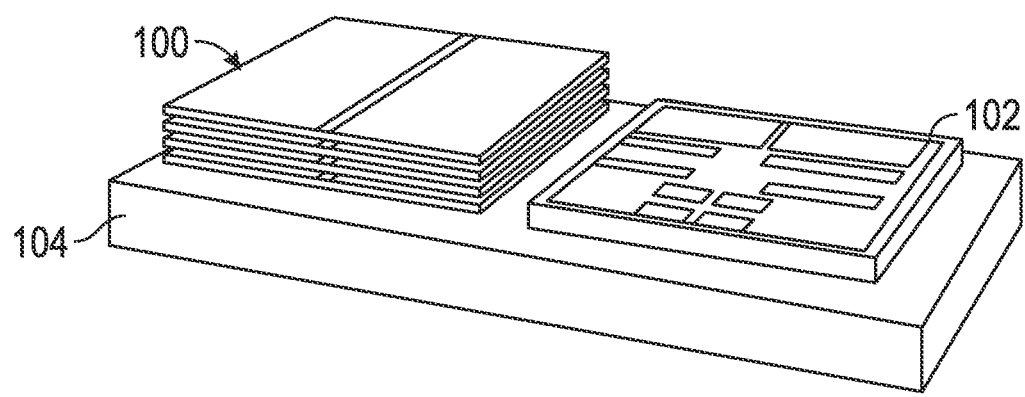
Figure 2:
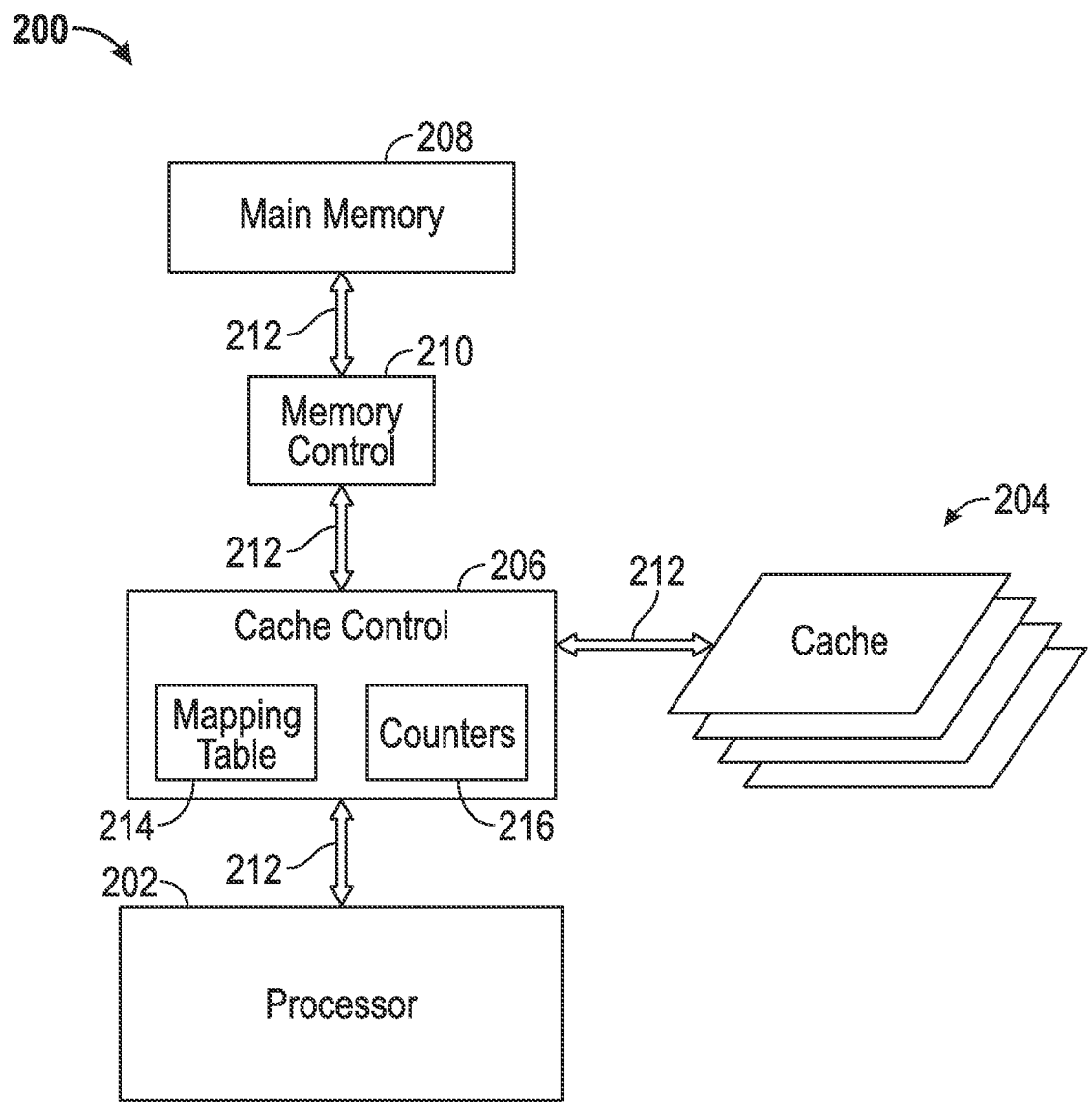
FIG. 2 is the block diagram of a processor and cache system according to embodiments.

Referring now to FIG. 2, a simplified block diagram is shown illustrating a system 200, which may be a desktop computer, laptop computer, server, set top box, digital television, printer, camera, motherboard, or any other device employing data processors. In the embodiment illustrated in FIG. 2, the system 200 includes a processor 202, a cache 204, a cache control 206, a main memory 208 and a memory control 210 each connected via an interconnect 212. In some embodiments, the cache memory 204 is a die-stacked cache (as show in FIGS. 1A and 1B), which may be used for high bandwidth, low latency data transfer from the cache 210 to the processor 202.

The processor 202 may be any type of "processing unit" known in the art (e.g., a central processor unit (CPU), a heterogeneous processor unit, an accelerated processing unit (APU), graphics processing unit (GPU), a network processing unit, a security processing unit, a compression processing unit). As used herein, the term "processing unit" refers to hardware within a computer system, that is designed execute a sequence of stored instructions of a computer program that is stored in some kind of memory by performing the basic arithmetical, logical, and input/output operations of the system 200. The processor 202 may be, for example, a single or multi-core general-purpose microprocessor. A microprocessor is a multipurpose, programmable device that accepts digital data as input, processes it according to instructions stored in a memory, and provides results as output.

In some embodiments, the processor 202 may be an accelerated processing unit (APU). An accelerated processing unit (APU) refers to a processing system that includes additional processing capability designed to accelerate one or more types of computations outside of a CPU. This may include a graphics processing unit (GPU) used for general-purpose computing (GPGPU), reconfigurable processing unit, a field-programmable gate array (FPGA), or similar specialized processing system. An APU can also refer to a processing device which integrates a CPU and a GPU on the same die, thus improving data transfer rates between these components while reducing power consumption. APUs can also include video processing and other application-specific accelerators.

In some embodiments, another implementation, the processor 202 may be a graphics processing unit (GPU) or a visual processing unit (VPU). A GPU (or VPU) can refer to any specialized electronic circuit designed to rapidly manipulate and alter memory in such a way so as to accelerate the building of images in a frame buffer intended for output to a display. GPUs are often used in embedded systems, mobile phones, personal computers, workstations, and game consoles.

The memory 208 and the cache 204 may be any type of memory including dynamic random access memory (DRAM), the various types of static RAM (SRAM), and the various types of non-volatile memory (e.g., PROM, EPROM, flash, phase change memory (PCM), resistive technologies such as memristors or spin-torque transfer magnetic RAM (STT-MRAM). In a non-limiting embodiment, the cache 204 employs die-stacking technology (as illustrated in FIG. 2) and is implemented as row-based DRAM.

According to non-limiting embodiments, the cache control 206 may dynamically change the organization or operating mode of one or more of the rows of cache 204 between an un-split mode and a split mode. The un-split mode (which is the default mode) operates at a cacheline granularity, while the split mode operates partially at cacheline granularity and also at page (all or a portion of a page depending upon page size) granularity. Changing modes of some or all of the rows is done dynamically allowing entire pages to be pinned in the cache 204 when beneficial for a workload, and then rapidly be returned into typical cacheline operation to achieve the full benefit of the overall cache size.

In some embodiments, the cache control 206 has a mapping table 214 that tracks the data pages that have been pinned to cache rows operating in the split mode and indicates which specific split cache rows a respective page of data has been stored in. In some embodiments, a page of data is pinned to specific cache rows based upon use metrics of the page. This may be realized in some embodiments by using one or more counters 216 within the cache control 206 to keep track of the number of accesses (e.g., read or write access) of data within a page. In some embodiments, when a page has a counter value that exceeds a certain threshold (alternatively, if the counter is incremented at a rate above a certain threshold rate), then the page is deemed to be heavily used and therefore should be pinned in the cache 204 (i.e., stored in one or more rows operated in the split mode). Alternately, if the counter is incremented at a rate above a certain threshold rate, that may be used to trigger the cache control to change one or more cache rows to the split mode and pin the page of data to the selected cache rows. As will be appreciated, numerous other memory access or use parameters may be used in any particular implementation to determine when a cacheline should be used in the split mode. The cache control 206 may determine to map and store the page of data in contiguous split mode cache rows or in cache rows distributed throughout the cache 204. In the event that cacheline data resides in cache rows determined by the cache control to be changed to split mode operation, that cacheline data must be moved or flushed from the cache 204 to store the page of data in split mode cache rows.

Figure 3:
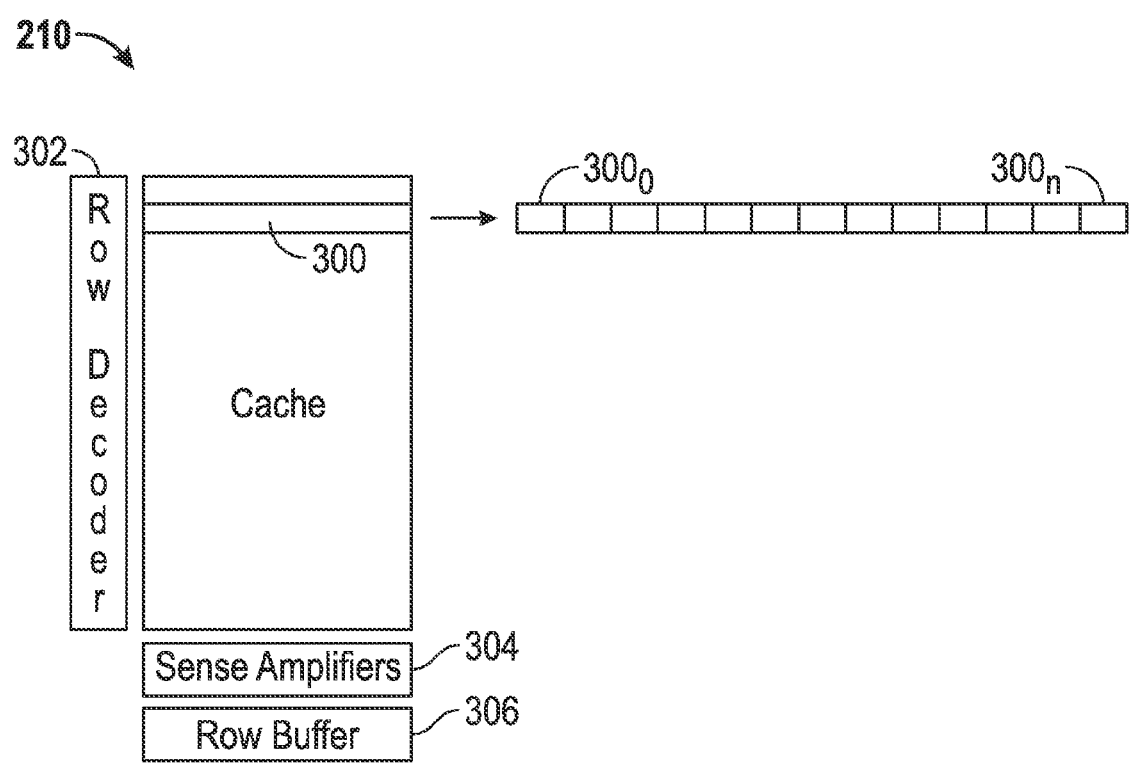
FIG. 3 is a block diagram of the cache of FIG. 2.

Referring now to FIG. 3, the cache (210 in FIG. 2) is shown in block diagram form. The cache 204 includes a plurality of memory rows 300 (only one illustrated in FIG. 3) which may also be referred to as a cache row. The memory rows 300 are accessed via a row decoder 302. As used herein, the term "access" regarding a cache memory refers to performing a read or a write request operation that may result in a cache hit if the requested data of a corresponding request address resides in the cache. Alternatively, the read or write operation may result in a cache miss if the requested data does not reside in the cache. When accessed by the row decoder 302, sense amplifiers 304 copy the entire contents of the selected row into the row buffer 306. In some embodiments, the circuits implementing the sense amplifiers 304 and the row buffer 306 may be combined into a single entity. This is done because reading a selected cache row is a "destructive" operation in DRAM. When data from a different cache row is to be accessed, the contents of the row buffer 306 may be "pre-charged" or "closed", which places the current values of the data stored in the row buffer 306 back into the memory cacheline from which it was copied. The size (i.e., number of rows) of the cache 210 may be determined by the system (200 in FIG. 2) designer for each particular implementation of the cache configuration. Each cache row 300 contains an arrangement of blocks ($300_0$-$300_n$) of information for storing the data. In some embodiments, each block contains 64 bytes and the size of the cache row is 32×64 bytes being capable of loading and storing 2048 bytes of data.

Figure 4:
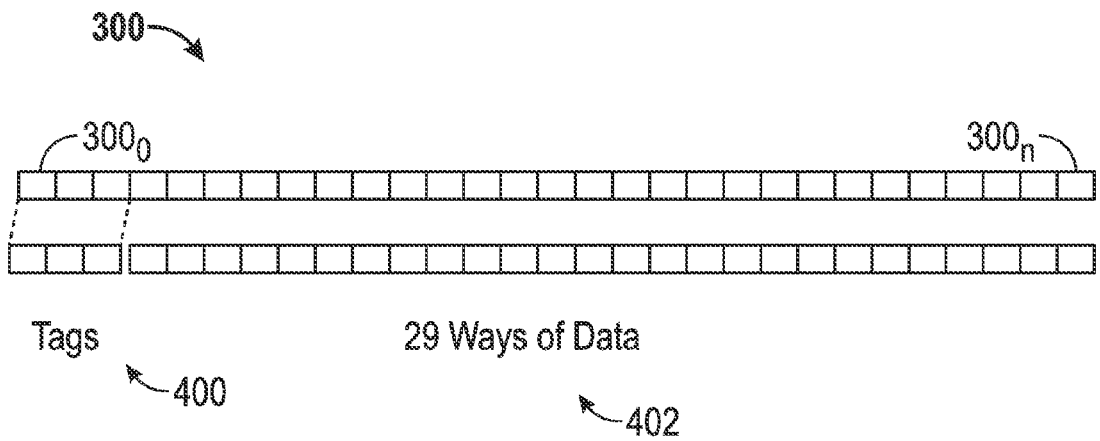
FIG. 4 is an illustration of a cache row operating in the un-split mode according to embodiments.

Referring now to FIG. 4, a cache row 300 is illustrated in the un-split mode of operation. As noted above, a cacheline is a set of bytes stored in contiguous memory locations, which are treated as a unit (or block) for coherency purposes. Typically, one or more blocks of data are reserved as a tag field 400 for storing status or other information, while the remaining blocks form a data field 402 have a plurality of blocks that operate as cachelines. In the illustrated example, three blocks $300_0$-$300_2$ are designated as a tag field 400, although more or fewer blocks could be designated as the tag field depending upon the amount of tag data to be stored. Some of the tag field would be used as a mode indicator to identify if the memory row was operating in the un-split mode or the split mode of operation. As a non-limiting example, if the cache row was 32 blocks long, a three block tag field (192 tag bits) would leave 29 cachelines (29×64 bits or 29 ways of data) in the data field 402 for a total of 2048 bytes in the cache row 300.

Figure 5:
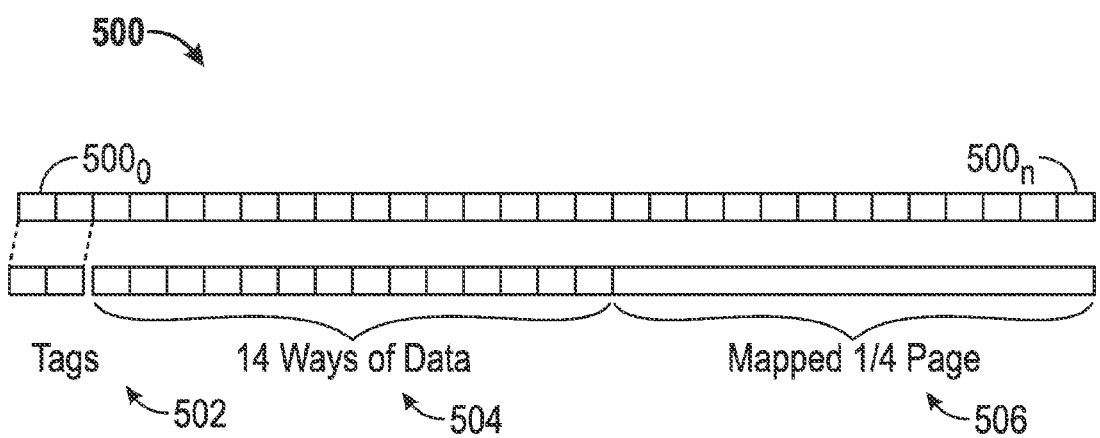
FIG. 5 is an illustration of a cache row operating in the split mode according to embodiments.

FIG. 5 illustrates a cache row 500 operating in the split mode of operation. As noted earlier, changing the operational mode of a cache row between the un-split mode and the split mode is a dynamic process affording the present disclosure the advantage of page granularity and cacheline granularity as required by a program (or workloads therein) being executed by the processor (202 in FIG. 2). In the split mode embodiment illustrated in FIG. 5, two blocks ($500_0$-$500_1$) are used as a tag field 502 and 14 blocks are used as a data field 504 (or 14 ways of data) for cachelines. The remaining blocks (1024 bytes) may become a mapped (by the memory controller 208 in FIG. 1) page area (or field) 506. This could store an entire page (for a 1 KB page), or perhaps more typically, a mapped ¼ for a 4 KB page size. As will be appreciated, for any other page size the mapped (or pinned) area (or field) 506 may be changed to be any fraction of a page as desired, with the remaining blocks being used as tag fields and cachelines. Thus, although the data field 504 is smaller than the data field 402 (FIG. 4) 14 cachelines are still provided along with a mapped page (or portion thereof) to provide page level granularity.

Figure 6:
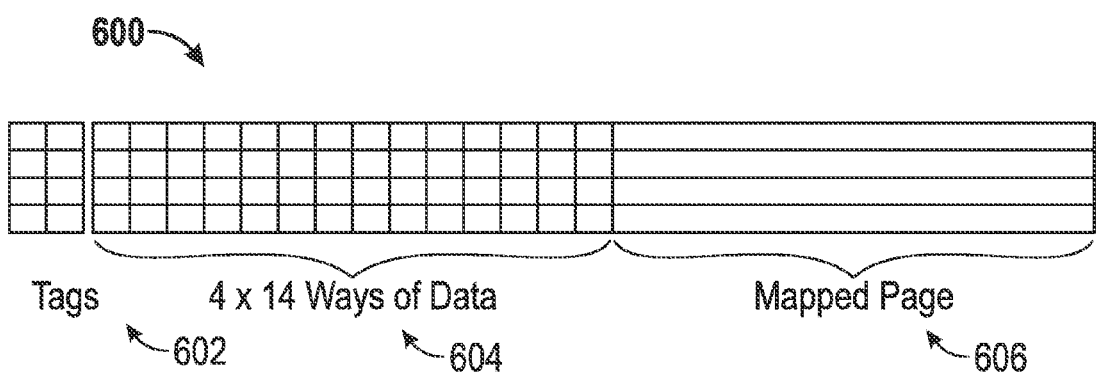
FIG. 6 is an illustration of a quad-set of cache rows operating in the split mode according to embodiments.

In non-limiting embodiments, a 4 KB page size is used in the system (200 in FIG. 2) resulting in a mapped ¼ page in each cache row operating in the split mode. Four memory rows are thus required for storing an entire page of data, and these memory rows may be distributed throughout the cache (204 in FIG. 2) and tracked or mapped by the cache control (206 in FIG. 2). However, since the page area (506 in FIG. 5) stores ¼ page, some embodiments contemplate that the memory controller may group memory rows (300 in FIG. 3) into a quadset 600 as illustrated in FIG. 6. In a quadset, four sequential or contiguous memory rows are mapped together as shown in FIG. 6. This provides a respective tag field 602, 4×14 ways of data in a data field 604 for cachelines and a mapped page 606. The cache controller (206 in FIG. 2) may set a mode indicator in the tag field to indicate that each row was operating in the split mode and that the memory row is part of a quadset.

Figure 7:
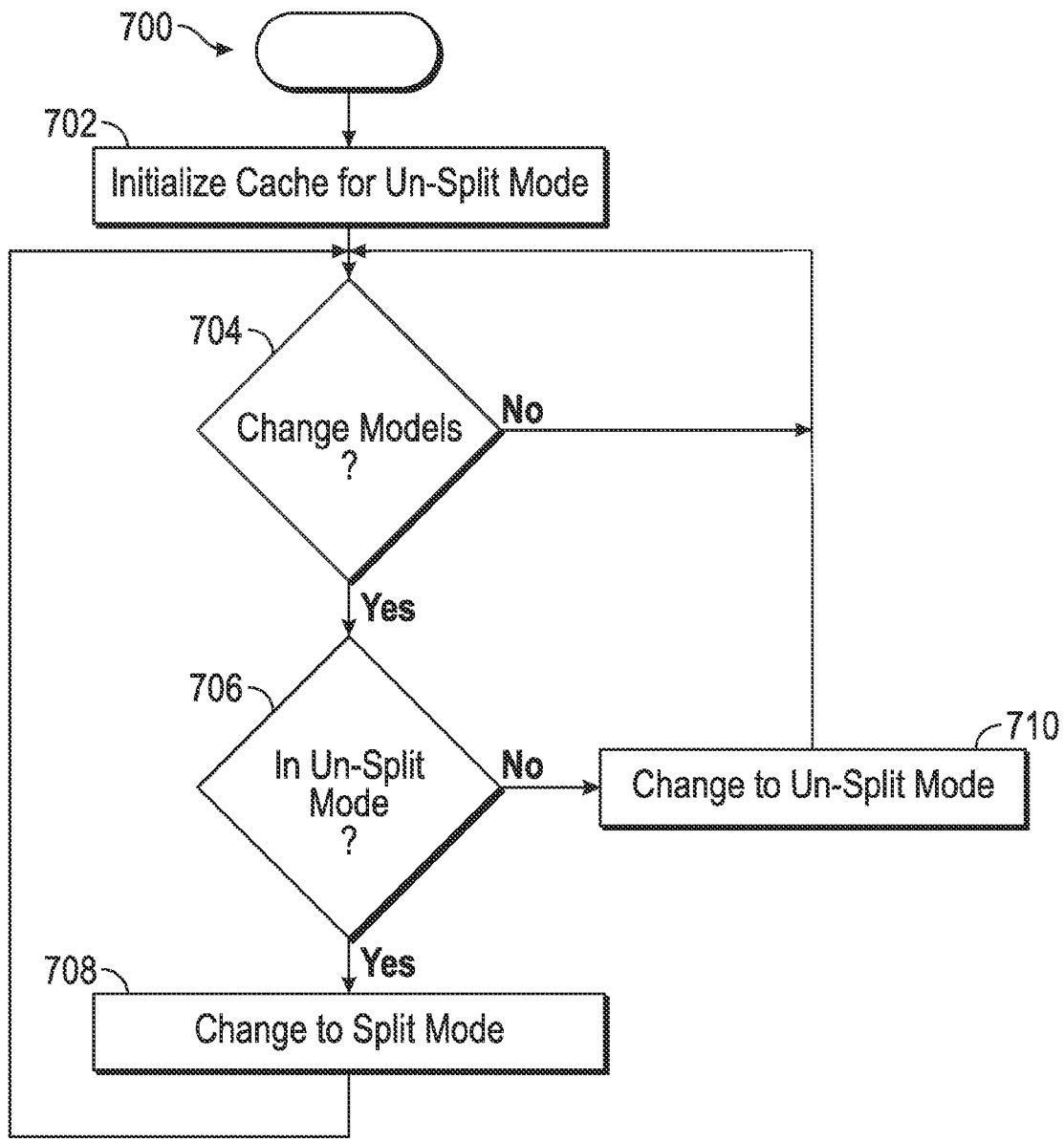
FIG. 7 is a flow diagram illustrating a method for changing the operating mode of cache rows according to embodiments.

FIG. 7 is a flow diagram useful for understanding the hybrid caching method 700 of the present disclosure. The various tasks performed in connection with the method of FIG. 7 may be performed by a processor executing software, hardware, firmware, or any combination thereof. For illustrative purposes, the following description of the method of FIG. 7 may refer to elements mentioned above in connection with FIGS. 1-6. In practice, portions of the method of FIG. 7 may be performed by different elements of the described system (200 in FIG. 2). It should also be appreciated that the method of FIG. 7 may include any number of additional or alternative tasks and that the method of FIG. 7 may be incorporated into a more comprehensive procedure or process having additional functionality not described in detail herein. Moreover, one or more of the tasks shown in FIG. 7 could be omitted from embodiments of the method of FIG. 7 as long as the intended overall functionality remains intact.

Referring now to FIG. 7, a flow diagram is provided illustrating a hybrid caching method 700 according to embodiments. The method 700 begins in block 702 where the cache (210 in FIG. 2) is initialized in the un-split mode. The un-split mode (normal cacheline operation) is the default mode of operation so the routine 700 initializes the cache in that way. Next, decision 704 determines whether a one or more of the cache rows are needed to change modes. A negative determination of decision 704 loops back while an affirmative determination proceeds to decision 706. If a mode change is needed, decision 706 determines whether the cache row(s) are presently operating in the un-split mode. If so, block 708 changes the mode to the split mode and routine loops back. Conversely, if a mode change is needed and the cache row(s) are not operating in the un-split mode, then those cache row(s) have previously been changed to the split mode for the benefit a program preferring page level granularity, which is no longer required (due to the change mode condition). Accordingly, block 710 changes the operating mode of those cache row(s) to the un-split mode to return those cache row(s) to cacheline operation. The hybrid cache method 700 thus affords a dynamic process for providing page level granularity when beneficial to a program (or workload) and returning the cache or portions thereof to normal cacheline granularity when page-level granularity is not beneficial.

Figure 8:
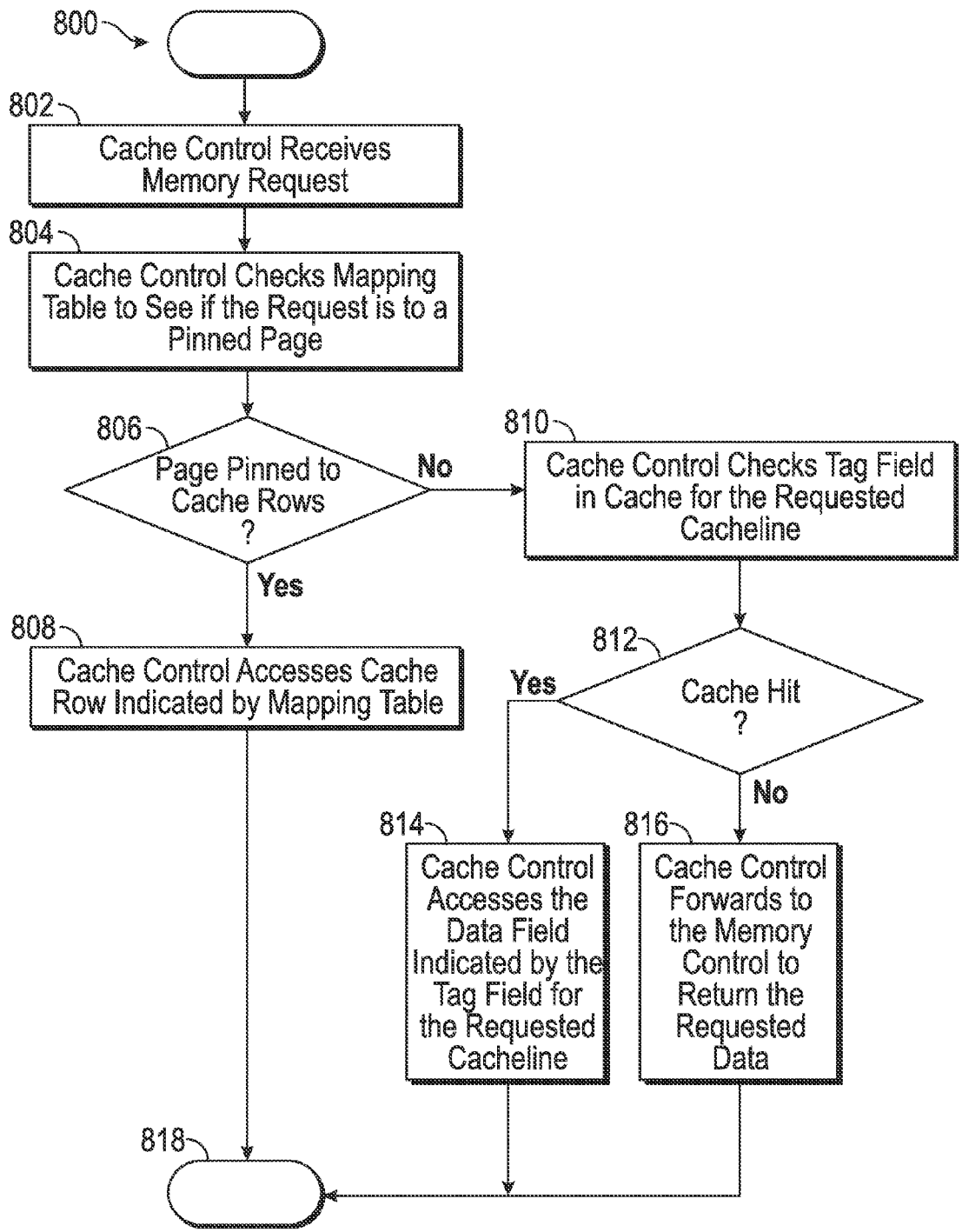
FIG. 8 is a flow diagram illustrating a method for accessing a cache memory according to embodiments.

Referring now to FIG. 8, a flow diagram is provided illustrating the operation of the hybrid caching method according to embodiments. The method 800 begins in block 802 where the cache control (206 in FIG. 2) receives a memory request (e.g., a read request or a write request) from the processor (202 in FIG. 2). In block 804, the cache control checks the mapping table (214 in FIG. 2) to determine whether the request is for a pinned page of data (block 804). If decision 806 determines that the request is for a pinned page, the cache control accesses the cache row (in the cache 204 of FIG. 2) indicated by the mapping table and returns it to the processor.

Conversely, if the determination of decision 806 is that the request is not to a pinned page, then the cache control (206 in FIG. 2) checks the tag field (400 in FIG. 4) for the requested cacheline (block 810). If the requested cacheline is located in the cache (204 in FIG. 2) a cache "hit" results and the cache control accesses the data field (402 in FIG. 4) indicated by the tag field for the requested cacheline. Conversely, if the requested cacheline is not located in the cache (204 in FIG. 2) a cache "miss" results and the cache control forwards the request to the memory control (210 in FIG. 2) so the requested data may be returned to the process (202 in FIG. 2) from the main memory (208 in FIG. 2) (block 816). Following completion of blocks 808, 814 or 816, the method 800 ends (block 818) until the next request from the processor (202 in FIG. 2).

A data structure representative of the system 200 and/or portions thereof included on a computer readable storage medium may be a database or other data structure which can be read by a program and used, directly or indirectly, to fabricate the hardware comprising the system 200. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the system 200. The netlist may then be placed and routed to produce a data set describing geometric shapes to be applied to masks. The masks may then be used in various semiconductor fabrication steps to produce a semiconductor circuit or circuits corresponding to the system 200. Alternatively, the database on the computer readable storage medium may be the netlist (with or without the synthesis library) or the data set, as desired, or Graphic Data System (GDS) II data.

In some embodiments, the method illustrated in FIG. 7 is performed by hardware or devices. In some embodiments, the method illustrated in FIG. 7 may be governed by instructions that are stored in a non-transitory computer readable storage medium and that are executed by at least one processor of the system 200. Each of the operations shown in FIG. 7 may correspond to instructions stored in a non-transitory computer memory or computer readable storage medium. In various embodiments, the non-transitory computer readable storage medium includes a magnetic or optical disk storage device, solid state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

While some embodiments have been presented in the foregoing detailed description, it should be appreciated that a vast number of variations exist. It should also be appreciated that the described embodiments are only examples, and are not intended to limit the scope, applicability, or configuration in any way. Rather, the foregoing detailed description will provide those skilled in the art with a convenient road map for implementing the embodiments, it being understood that various changes may be made in the function and arrangement of elements described in the embodiments without departing from the scope as set forth in the appended claims and their legal equivalents.

What is claimed is:

1. A method, comprising:
dynamically changing modes of one or more cache rows of a cache between an un-split mode having a first tag field and a first data field to a split mode having a second tag field, a second data field being smaller than the first data field and a mapped page field.

2. The method of claim 1, further comprising initializing the cache to operate in the un-split mode.

3. The method of claim 1, dynamically changing modes between the un-split mode to the split mode results in the second tag field being smaller than the first tag field.

4. The method of claim 1, further comprising mapping a plurality of split mode cache rows in the cache wherein the mapped page field of the plurality of split mode cache rows can store one page of data in cache rows distributed through the cache.

5. The method of claim 1, further comprising setting an indicator in the tag field to identify operation of a cache row in the un-split mode or the split mode.

6. The method of claim 1, further comprising processing data at cacheline granularity from cache rows in the un-split mode.

7. The method of claim 1, further comprising processing data at page granularity from cache rows in the split mode.

8. A system, comprising:
a processor;
a memory coupled to the processor; and
a cache coupled to the processor and the memory;
wherein, the cache is configured to:
operate one or more cache rows in an un-split mode having a first tag field and a first data field;
operate one or more cache rows in a split mode having a second tag field, a second data field being smaller than the first data field and a page field; and
dynamically change modes of the cache rows from the un-split mode to the split mode.

9. The system of claim 8, wherein the cache comprises a row-based memory.

10. The system of claim 9, wherein the cache comprises a die-stacked Dynamic Random Access Memory (DRAM) cache.

11. The system of claim 8, further comprising a memory control and a cache control operably coupled to the processor, the memory and the cache.

12. The system of claim 11, wherein the cache control is configured to initialize the cache to operate in the un-split mode.

13. The system of claim 11, wherein the cache control is configured to group a plurality of split mode cache rows of the cache wherein the mapped page field of the group can store one page of data in consecutive split mode cache rows.

14. The system of claim 11, wherein the cache control is configured to map a plurality of split mode cache rows in the cache wherein the mapped page field of the plurality of split mode cache rows can store one page of data in cache rows distributed through the cache.

15. The system of claim 11, wherein the cache control is configured to set an indicator in the first or second tag field to identify operation of a cache row in the un-split mode or the split mode.

16. A method, comprising:
receiving a memory request from a processor;
returning at least some data from the page to the processor when a page corresponding to the memory request is present in cache rows of a cache operating in the split mode; and
returning a cacheline corresponding to the memory request to the processor when the cacheline is present in the cache row operating in the un-split mode.

17. The method of claim 16, forwarding the memory request to a memory control of a main memory when the memory request is not in the cache.

18. The method of claim 16, further comprising determining whether the page is pinned to cache rows operating in the split mode within the cache by examining a mapping table of a cache control to determine whether the page pinned the cache rows operating in the split mode within the cache.

19. The method of claim 16, further comprising determining whether the cacheline is stored in a cache row operating in the un-split mode by examining a tag field of the cache row operating in the up-split mode within the cache.

20. The method of claim 16, further comprising determining to convert one or more un-split cache rows of the cache to operate in the split-mode and pin a page of data thereto responsive to a counter within a cache control exceeding an access threshold or rate of access threshold.

* * * * *